(12) United States Patent
Sugiyama

(10) Patent No.: US 10,502,901 B2
(45) Date of Patent: Dec. 10, 2019

(54) TUNABLE LIGHT SOURCE AND OPTICAL MODULE

(71) Applicant: Fujitsu Optical Components Limited, Kawasaki-shi, Kanagawa (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/047,498

(22) Filed: Jul. 27, 2018

(65) Prior Publication Data

US 2019/0041581 A1  Feb. 7, 2019

(30) Foreign Application Priority Data

Aug. 3, 2017 (JP) ................. 2017-150987

(51) Int. Cl.
*G02B 6/26* (2006.01)
*G02B 6/28* (2006.01)
*G02B 6/42* (2006.01)
*G02B 6/293* (2006.01)

(52) U.S. Cl.
CPC ..... *G02B 6/29395* (2013.01); *G02B 6/29344* (2013.01)

(58) Field of Classification Search
CPC .......... G02B 6/29395; G02B 6/29344
USPC ........................ 385/24–27, 31, 32
See application file for complete search history.

(56) References Cited

U.S. PATENT DOCUMENTS

| | | | | |
|---|---|---|---|---|
| 6,639,922 B2 * | 10/2003 | Vakhshoori | ............... | G01J 3/26 372/20 |
| 6,813,291 B2 * | 11/2004 | Wang | ........................ | G01J 3/26 372/43.01 |
| 6,819,466 B2 * | 11/2004 | Tayebati | ............. | G02F 1/01708 359/245 |
| 6,934,033 B2 * | 8/2005 | McDaniel | ............ | G02B 26/001 356/454 |
| 2011/0122906 A1 * | 5/2011 | Seeley | .................. | G01J 9/0246 372/38.07 |

(Continued)

FOREIGN PATENT DOCUMENTS

WO   WO 2016/010528 A1   1/2016

OTHER PUBLICATIONS

K. Voigt et al., "Fully passive Si-photonic 90° hybrid for coherent receiver applications", ECOC Technical Digest, Jul. 27, 2011, pp. 3.

*Primary Examiner* — Kaveh C Kianni
*Assistant Examiner* — Hung Q Lam
(74) *Attorney, Agent, or Firm* — Staas & Halsey LLP

(57) ABSTRACT

A tunable light source includes a light source; a wavelength selecting device that selects, according to a control signal, output light with a specific wavelength from light output from the light source; and a wavelength monitor including a wavelength filter including multiple output ports corresponding to filtering paths through which the output light passes, and a light-receiving device that is disposed to face one of the output ports and receives light output from the one of the output ports. The wavelength filter is configured such that a maximum quantity of the light output from the one of the output ports facing the light-receiving device becomes greater than a maximum quantity of light output from another one of the output ports.

7 Claims, 9 Drawing Sheets

(56) References Cited

U.S. PATENT DOCUMENTS

2015/0043000 A1\* 2/2015 Mochizuki ............ G01J 1/4257
356/454
2015/0085292 A1 3/2015 Uesaka et al.

\* cited by examiner

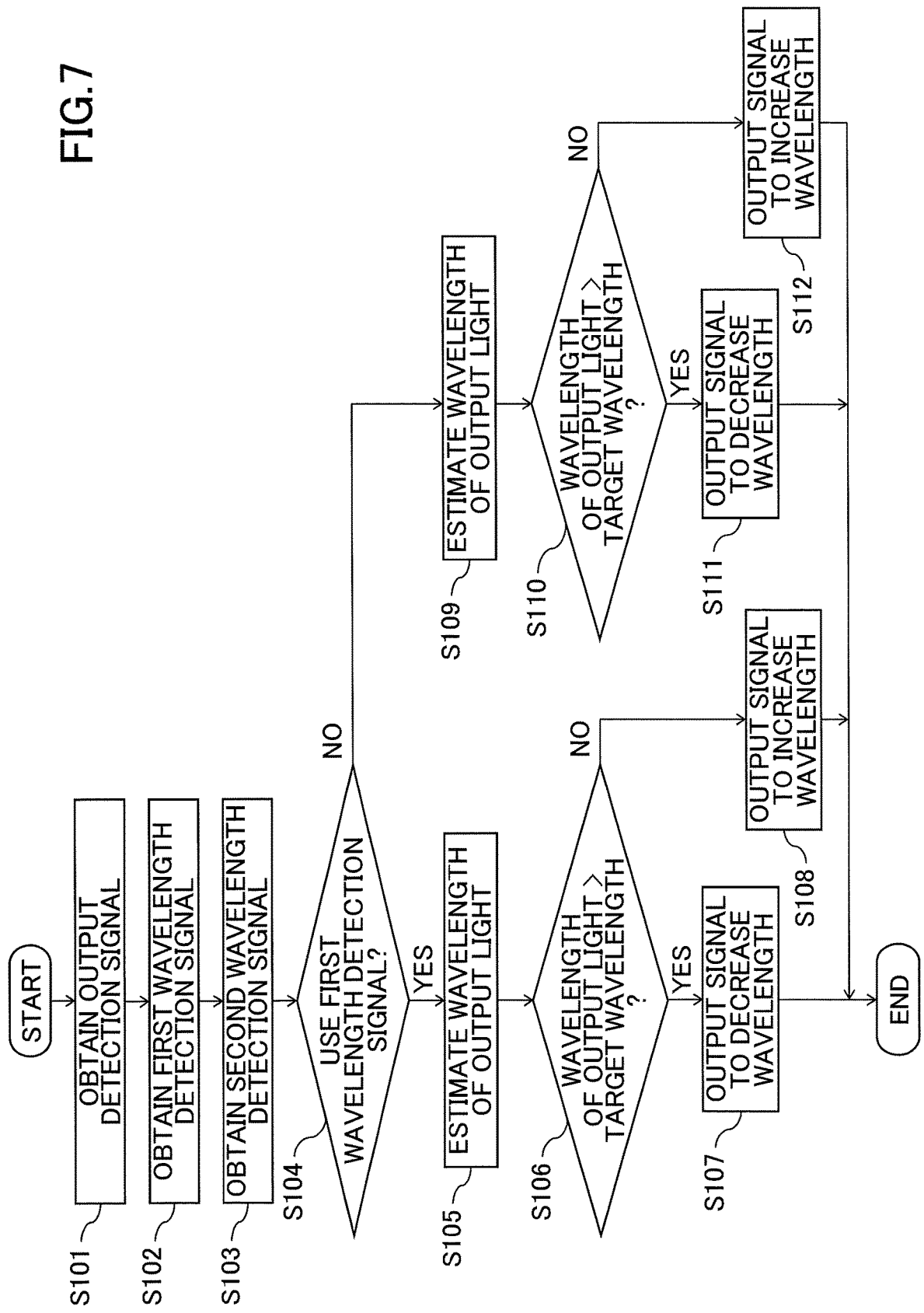

FIG.9

|  |  | INPUT WAVEGUIDE ||||  OUTPUT WAVEGUIDE ||||
|---|---|---|---|---|---|---|---|---|---|
|  |  | FIRST | SECOND | THIRD | FOURTH | FIRST | SECOND | THIRD | FOURTH |
| FIRST GROUP | FIRST PATTERN | ○ | ○ |  |  | ○ | ○ |  |  |
| | SECOND PATTERN | ○ | ○ |  |  | ○ |  | ○ |  |
| | THIRD PATTERN | ○ | ○ |  |  |  | ○ |  | ○ |
| | FOURTH PATTERN | ○ | ○ |  |  |  |  | ○ | ○ |
| SECOND GROUP | FIFTH PATTERN | ○ |  | ○ |  | ○ | ○ |  |  |
| | SIXTH PATTERN | ○ |  | ○ |  | ○ |  | ○ |  |
| | SEVENTH PATTERN | ○ |  | ○ |  |  | ○ |  | ○ |
| | EIGHTH PATTERN | ○ |  | ○ |  |  |  | ○ | ○ |
| THIRD GROUP | NINTH PATTERN |  | ○ |  | ○ | ○ | ○ |  |  |
| | TENTH PATTERN |  | ○ |  | ○ | ○ |  | ○ |  |
| | ELEVENTH PATTERN |  | ○ |  | ○ |  | ○ |  | ○ |
| | TWELFTH PATTERN |  | ○ |  | ○ |  |  | ○ | ○ |
| FOURTH GROUP | THIRTEENTH PATTERN |  |  | ○ | ○ | ○ | ○ |  |  |
| | FOURTEENTH PATTERN |  |  | ○ | ○ | ○ |  | ○ |  |
| | FIFTEENTH PATTERN |  |  | ○ | ○ |  | ○ |  | ○ |
| | SIXTEENTH PATTERN |  |  | ○ | ○ |  |  | ○ | ○ |

TUNABLE LIGHT SOURCE AND OPTICAL MODULE

CROSS-REFERENCE TO RELATED APPLICATION

This application is based upon and claims the benefit of priority of Japanese Patent Application No. 2017-150987 filed on Aug. 3, 2017, the entire contents of which are incorporated herein by reference.

FIELD

An aspect of this disclosure relates to a tunable light source and an optical module.

BACKGROUND

There is a known wavelength monitor including a 90° hybrid that is an optical divider implemented by a multi-mode interference (MMI) waveguide having four input ports and four output ports (4×4 MMI) (see, for example, US Patent Application Publication No. 2015/0085292 and WO 2016/010528). In such a wavelength monitor, input light is split into light beams by a splitter, and the light beams are input via two waveguides with different lengths to the 90° hybrid implemented by the 4×4 MMI, which then outputs multiple light beams with different filtering characteristics.

However, among four light beams output from the 90° hybrid, only two light beams are generally used by the wavelength monitor and the other two light beams are not used by the wavelength monitor. Accordingly, with this wave monitor, a half of the input light is wasted.

SUMMARY

According to an aspect of this disclosure, there is provided a tunable light source that includes a light source; a wavelength selecting device that selects, according to a control signal, output light with a specific wavelength from light output from the light source; and a wavelength monitor including a wavelength filter including multiple output ports corresponding to filtering paths through which the output light passes, and a light-receiving device that is disposed to face one of the output ports and receives light output from the one of the output ports. The wavelength filter is configured such that a maximum quantity of the light output from the one of the output ports facing the light-receiving device becomes greater than a maximum quantity of light output from another one of the output ports.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a flowchart illustrating a wavelength control process performed by a wavelength controller in FIG. 3;

FIG. 9 is a table illustrating combinations of input waveguides and output waveguides.

DESCRIPTION OF EMBODIMENTS

A tunable light source and an optical module according to embodiments are described below with reference to the accompanying drawings. However, the technical scope of the present invention is not limited to those embodiments.

<Tunable Light Source of Related Art>

Before describing a tunable light source and an optical module of embodiments, a tunable light source of the related art is described.

Figure 1:
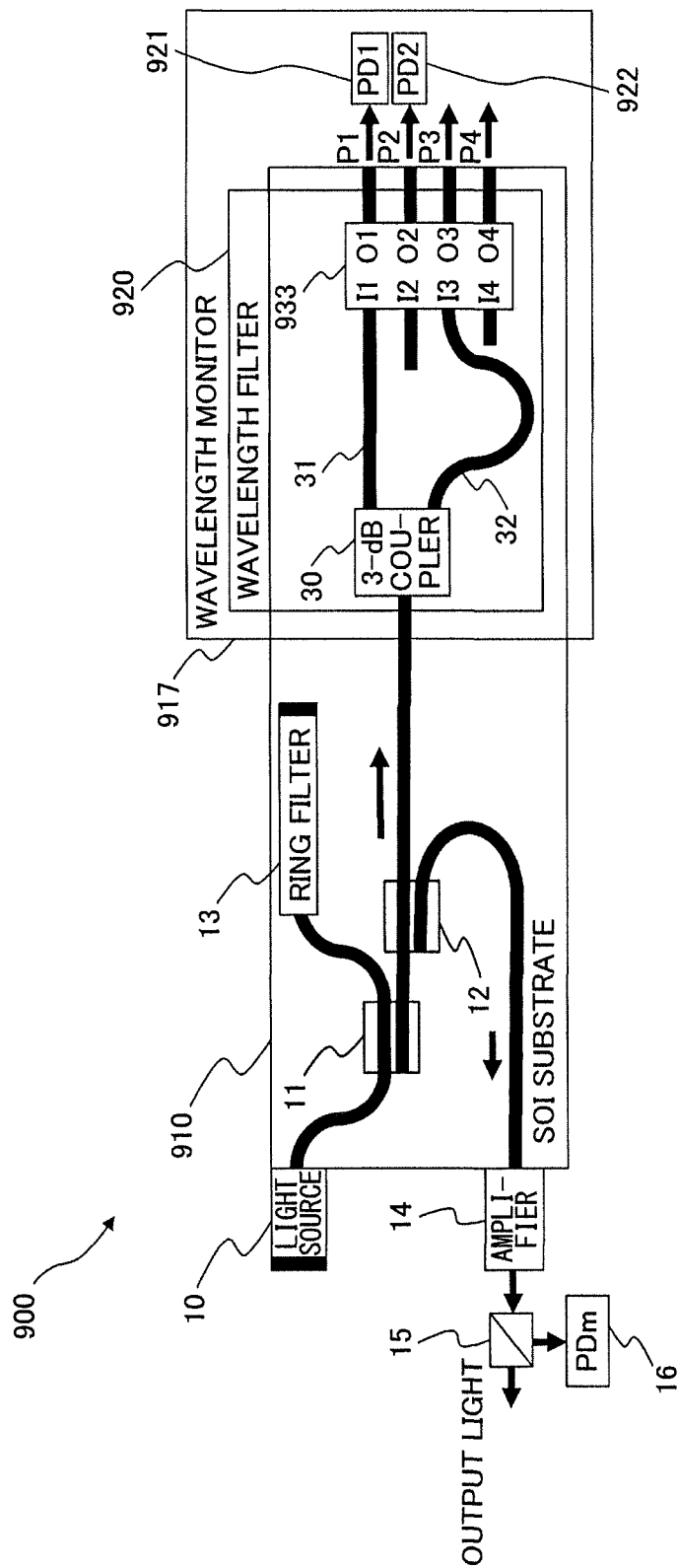
FIG. 1 is a drawing illustrating an optical unit of a tunable light source of the related art.

FIG. 1 is a drawing illustrating an optical unit 900 of a tunable light source of the related art.

The optical unit 900 may also be referred to as a tunable laser source (TLS), and includes a light source 10, a first tap 11, a second tap 12, a ring filter 13, an amplifier 14, a beam splitter 15, an output monitoring device 16, and a wavelength monitor 917.

The light source 10 is, for example, a semiconductor laser comprised of a semiconductor material such as GaAs/AlGaAs. The light source 10 may be, for example, a semiconductor optical amplifier (SOA) that emits natural light. The first tap 11 and the second tap 12 are splitters that split input light, and are formed on a Silicon On Insulator (SOI) substrate 910 together with waveguides that guide output light from the light source 10 to the ring filter 13, the amplifier 14, and the wavelength monitor 917. The light source 10 outputs light whose quantity corresponds to an electric current corresponding to a control signal input from a controller (not shown). Because the configurations of optical waveguides and optical devices formed on the SOI substrate 910 are well known, detailed descriptions of those components are omitted here.

The first tap 11 is configured such that the quantity of light output to the ring filter 13 becomes greater than the quantity of light output to the second tap 12. For example, the first tap 11 is configured such that the quantity of light output to the ring filter 13 becomes ten times greater than the quantity of light output to the second tap 12.

The second tap 12 is configured such that the quantity of light output to the amplifier 14 becomes greater than the quantity of light output to the wavelength monitor 917. For example, the second tap 12 is configured such that the quantity of light output to the amplifier 14 becomes ten times greater than the quantity of light output to the wavelength monitor 917.

The ring filter 13 may also be referred to as a "ring resonator". The ring filter 13 and the light source 10 form a resonator whose resonant frequency is controlled by an applied temperature. That is, the resonant frequency of the resonator formed by the light source 10 and the ring filter 13 is controlled by adjusting a temperature applied to the ring filter 13. The temperature of the ring filter 13 is adjusted, for example, by adjusting an electric current supplied to a heater such as a Peltier device disposed near the ring filter 13. The ring filter 13 functions as a wavelength selecting device that selects, as output light, light with a specific wavelength from light output from the light source 10 according to a wavelength control signal input from the controller (not shown). Because the configuration of a ring filter is well known, detailed descriptions of the ring filter 13 are omitted here.

The amplifier 14 is formed of a semiconductor material such as GaAs/AlGaAs and is an SOA that amplifies output light input via the second tap 12. The beam splitter 15 outputs a portion of the output light amplified by the amplifier 14 to the output monitoring device 16. The output monitoring device 16 is, for example, a photodiode. The output monitoring device 16 receives light input via the beam splitter 15, and outputs an electric current corresponding to the quantity of the received light to the controller (not shown).

The wavelength monitor 917 includes a wavelength filter 920, a first monitoring device 921, and a second monitoring device 922. The first monitoring device 921 and the second monitoring device 922 are, for example, photodiodes. Each of the first monitoring device 921 and the second monitoring device 922 outputs, to the controller, an electric current corresponding to the quantity of light input via the wavelength filter 920.

The wavelength filter 920 includes a splitter 30, a first waveguide 31, a second waveguide 32, and a 90° hybrid 933. The wavelength filter 920 includes four output ports corresponding to four filtering paths through which output light passes.

The splitter 30 is, for example, a 3-dB coupler and splits light output from the second tap 12 into first light output to the first waveguide 31 and second light output to the second waveguide 32. The splitter 30 is configured such that the quantity of the first light output to the first waveguide 31 becomes the same as the quantity of the second light output to the second waveguide 32.

The first waveguide 31 is disposed between the splitter 30 and the 90° hybrid 933, and the first light of the light split by the splitter 30 passes through the first waveguide 31. The second waveguide 32 is longer than the first waveguide 31 and disposed between the splitter 30 and the 90° hybrid 933. The second light of the light split by the splitter 30 passes through the second waveguide 32.

The 90° hybrid 933 is an optical divider implemented by a 4×4 MMI waveguide having four input ports and four output ports. The 90° hybrid 933 is configured such that the maximum quantities of first light (beam) P1, second light (beam) P2, third light (beam) P3, and fourth light (beam) P4 output from a first output port O1, a second output port O2, a third output port O3, and a fourth output port O4 become equal to each other. The 90° hybrid 933 combines light input to a first input port I1 via the first waveguide 31 and light input to a third input port I3 via the second waveguide 32, and outputs the combined light from the first output port O1, the second output port O2, the third output port O3, and the fourth output port O4. No light is input to a second input port I2 and a fourth input port I4 of the 90° hybrid 933. The first output port O1 is disposed to face the first monitoring device 921, and the second output port O2 is disposed to face the second monitoring device 922. Because the configuration of a 4×4 MMI is well known, detailed descriptions of the 90° hybrid 933 are omitted here.

The wavelength filter 920 functions as a delay-line interferometer filter. The transmittance of light output from each of the first output port O1, the second output port O2, the third output port O3, and the fourth output port O4 changes depending on the wavelength.

Figure 2:
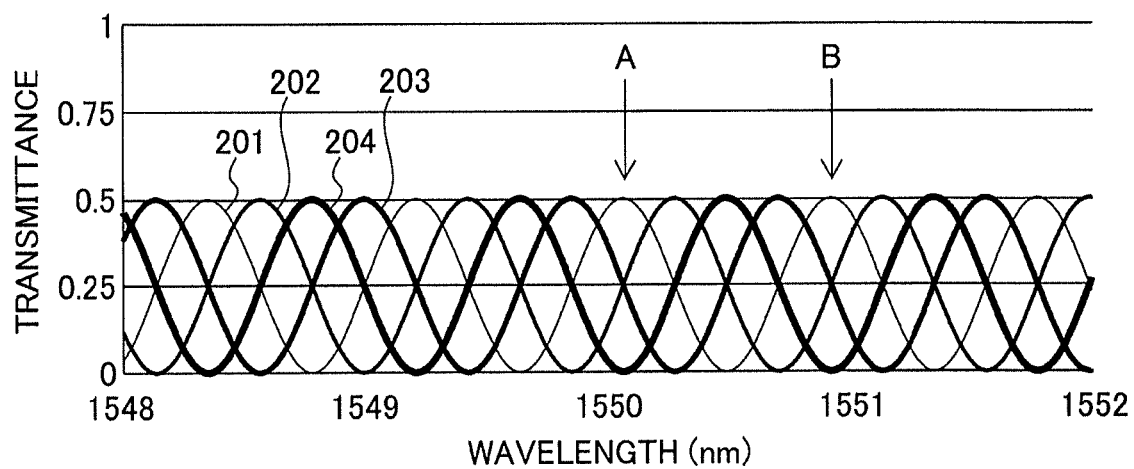
FIG. 2 is a graph illustrating an example of a filtering characteristic of a wavelength filter in FIG. 1.

FIG. 2 is a graph illustrating a filtering characteristic of the wavelength filter 920. In FIG. 2, the horizontal axis indicates the wavelength of light input to the wavelength filter 920, and the vertical axis indicates the transmittance of light output from each of the first output port O1, the second output port O2, the third output port O3, and the fourth output port O4. A waveform 201 indicates the transmittance of the first light P1 output from the first output port O1, and a waveform 202 indicates the transmittance of the second light P2 output from the second output port O2. A waveform 203 indicates the transmittance of the third light P3 output from the third output port O3, and a waveform 204 indicates the transmittance of the fourth light P4 output from the fourth output port O4. The optical transmittance of light output from each of the first output port O1, the second output port O2, the third output port O3, and the fourth output port O4 is indicated by a ratio of the quantity of light output from each of the first output port O1, the second output port O2, the third output port O3, and the fourth output port O4 to the total quantity of light output from the first output port O1, the second output port O2, the third output port O3, and the fourth output port O4.

In FIG. 2, near a wavelength of 1550 nm indicated by an arrow A, where the transmittance of each of the first light P1 and the fourth light P4 is about 0.25, the slope of the waveform 201 of the first light P1 and the slope of the waveform 204 of the fourth light P4 become maximum. That is, near the wavelength of 1550 nm, the rate of change in the transmittance of each of the first light P1 and the fourth light P4 in relation to wavelength variations becomes maximum.

Also in FIG. 2, near a wavelength of 1551 nm indicated by an arrow B, where the transmittance of each of the second light P2 and the third light P3 is about 0.25, the slope of the waveform 202 of the second light P2 and the slope of the waveform 203 of the third light P3 become maximum. That is, near the wavelength of 1551 nm, the rate of change in the transmittance of each of the second light P2 and the third light P3 in relation to wavelength variations becomes maximum.

When the wavelength of output light is controlled by adjusting the temperature applied to the ring filter 13 based on the rate of change in transmittance in relation to wavelength variations, the accuracy of controlling the wavelength of output light increases as the rate of change in transmittance in relation to wavelength variations increases. Near the wavelength of 1550 nm indicated by the arrow A in FIG. 2, the controller adjusts the temperature applied to the ring filter 13 according to an electric current input from the first monitoring device 921 that receives the first light P1 whose change rate in transmittance in relation to wavelength variations is maximum. On the other hand, near the wavelength of 1551 nm indicated by the arrow B in FIG. 2, the controller adjusts the temperature applied to the ring filter 13 according to an electric current input from the second monitoring device 922 that receives the second light P2 whose change rate in optical transmittance in relation to wavelength variations is maximum. It is possible to accurately control the wavelength of output light by adjusting the temperature applied to the ring filter 13 based on an electric current input from a monitoring device that receives light whose change rate in optical transmittance in relation to wavelength variations is maximum.

However, with the configuration of FIG. 1, among the first light P1, the second light P2, the third light P3, and the fourth light P4 that are output from the first output port O1, the second output port O2, the third output port O3, and the fourth output port O4 of the 90° hybrid 933, only the first light P1 and the second light P2 are used for the wavelength control, and the third light P3 and the fourth light P4 are not used for the wavelength control. As described above, the 90° hybrid 933 is configured such that the maximum quantities of the first light P1, the second light P2, the third light P3, and the fourth light P4 become equal to each other. Accordingly, the sum of the quantities of the first light P1 and the second light P2 is one half of the total quantity of light input to the 90° hybrid 933.

The quantity of light received by each of the first monitoring device 921 and the second monitoring device 922 can be increased by increasing the ratio of the quantity of light output from the second tap 12 to the wavelength monitor 917. However, if the ratio of the quantity of light output from the second tap 12 to the wavelength monitor 917 is increased, the quantity of output light output via the amplifier 14 decreases. Accordingly, this approach is not preferable.

Also, the quantity of light received by each of the first monitoring device 921 and the second monitoring device 922 can be increased by increasing the quantity of light output by the light source 10. However, if the quantity of light output by the light source 10 is increased, the power consumption of the optical unit 900 increases. Accordingly, this approach is also not preferable.

<Tunable Light Source of Embodiment>

In a tunable light source according to an embodiment, the maximum quantity of light output from an output port of a wavelength filter disposed to face a light-receiving device is greater than the maximum quantity of light output from an output port of the wavelength filter disposed not to face the light-receiving device. That is, in the tunable light source of the embodiment, the quantity of light to be received by the light-receiving device is greater than the quantity of light not received by any light-receiving device. This configuration makes it possible to increase the quantity of light received by the light-receiving device without increasing the quantity of light input to the wavelength filter.

<Configuration and Functions of Tunable Light Source of Embodiment>

Figure 3:
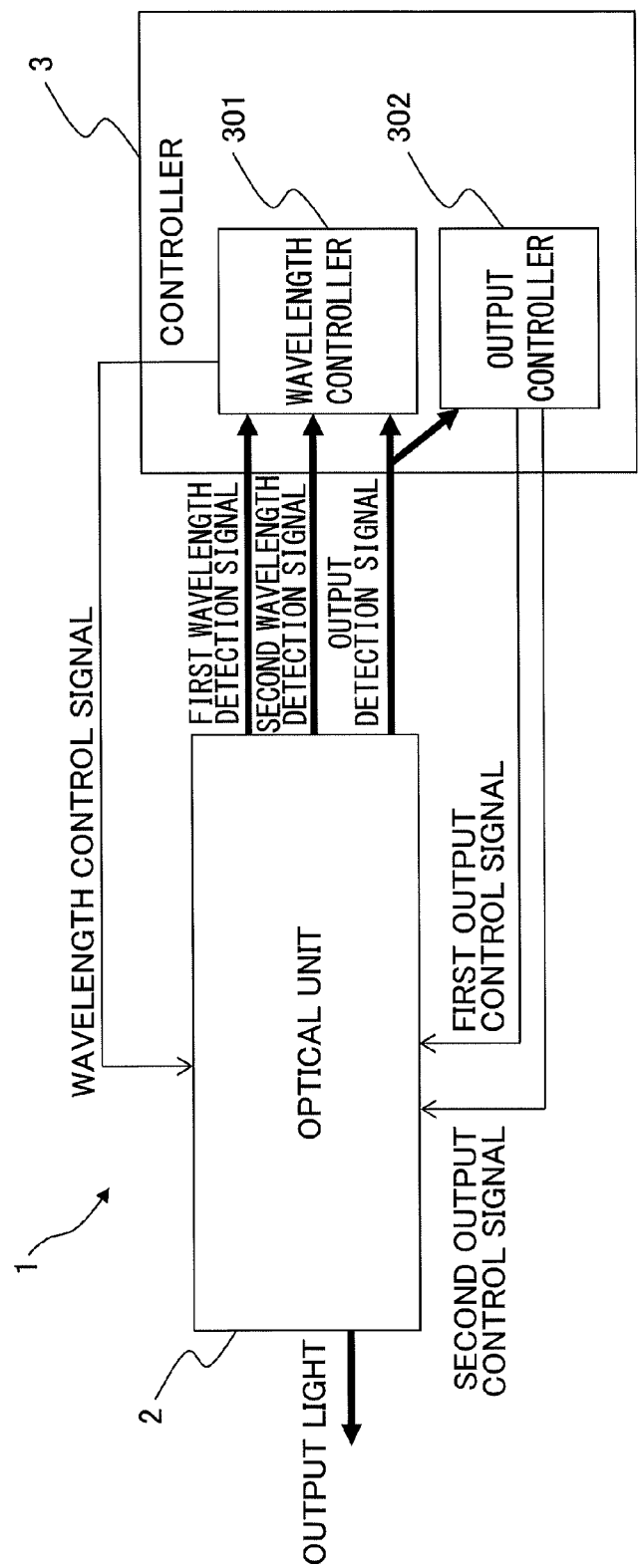
FIG. 3 is a block diagram of a tunable light source according to an embodiment.
Figure 4:
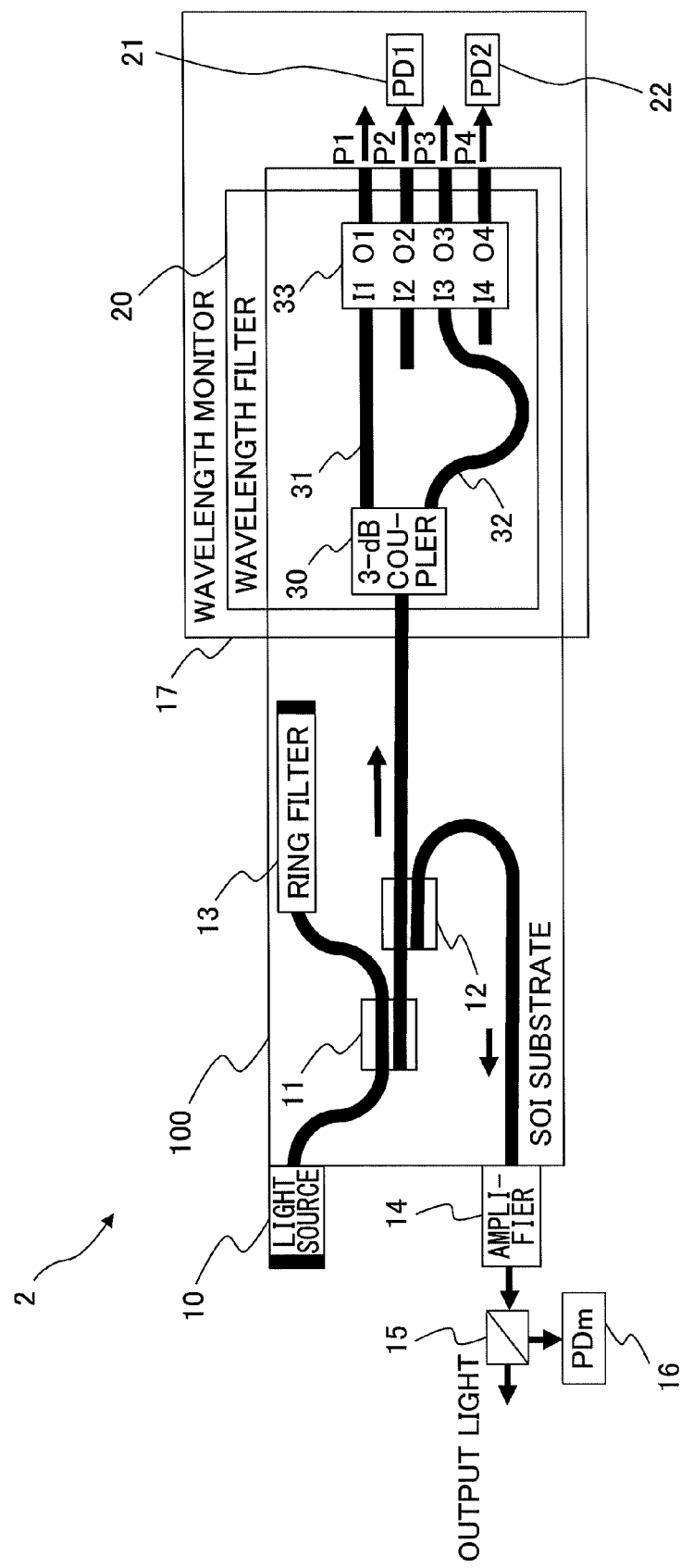
FIG. 4 is a block diagram of an optical unit in FIG. 3.

FIG. 3 is a block diagram of a tunable light source 1 according to an embodiment, and FIG. 4 is a block diagram of an optical unit 2 in FIG. 3.

The tunable light source 1 includes the optical unit 2 and a controller 3. The optical unit 2 is different from the optical unit 900 in that the wavelength monitor 917 is replaced with a wavelength monitor 17. The configurations and functions of components of the optical unit 2 other than the wavelength monitor 17 are substantially the same as those of the corresponding components of the optical unit 900, and therefore detailed descriptions of those components are omitted here.

The wavelength monitor 17 includes a wavelength filter 20, a first monitoring device 21, and a second monitoring device 22. The first monitoring device 21 and the second monitoring device 22 are examples of light-receiving devices such as photodiodes. The first monitoring device 21 and the second monitoring device 22 output, to the controller 3, electric currents corresponding to the quantities of light received via the wavelength filter 20 as a first wavelength detection signal and a second wavelength detection signal.

The wavelength filter 20 is different from the wavelength filter 920 in that the 90° hybrid 933 is replaced with a 90° hybrid 33. The configurations and functions of components of the wavelength filter 20 other than the 90° hybrid 33 are substantially the same as those of the corresponding components of the wavelength filter 920, and therefore detailed descriptions of those components are omitted here. The 90° hybrid 33 is an optical divider that combines first light received from the first waveguide 31 and second light received from the second waveguide 32, splits the combined light into four light beams, and outputs the light beams to the first output port O1, the second output port O2, the third output port O3, and the fourth output port O4.

Figure 5:
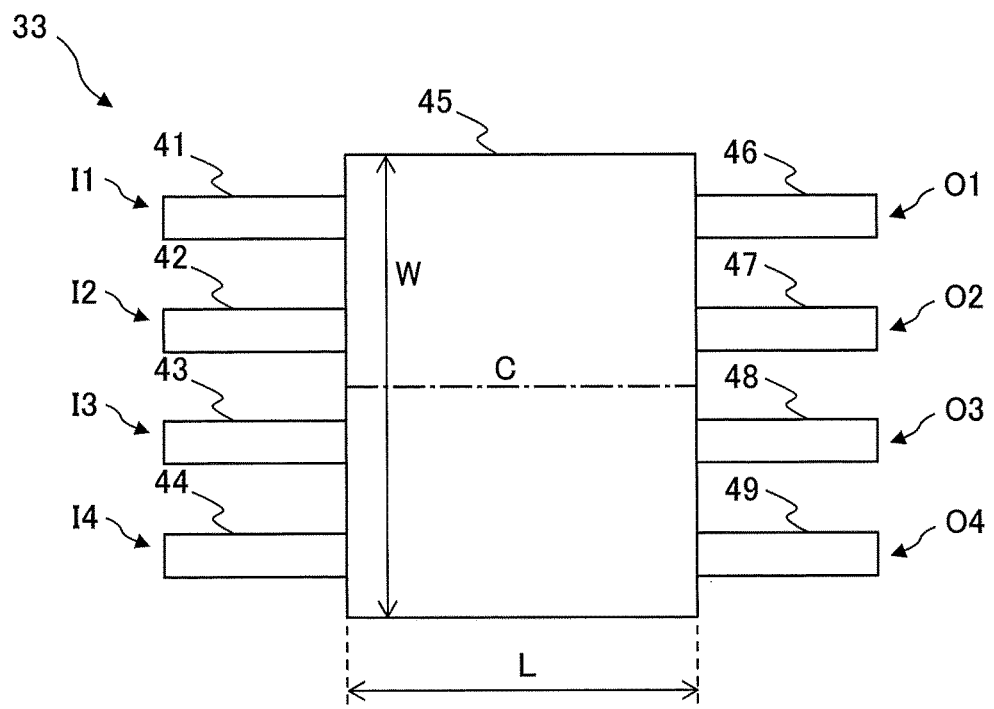
FIG. 5 is a drawing illustrating a 90° hybrid in FIG. 4.

FIG. 5 illustrates the 90° hybrid 33.

The 90° hybrid 33 is an optical divider implemented by a 4×4 MMI waveguide, and includes first through fourth input waveguides 41-44, an optical coupler 45, and first through fourth output waveguides 46-49. The first through fourth input waveguides 41-44, the optical coupler 45, and the first through fourth output waveguides 46-49 are optical waveguides formed on an SOI substrate 100. Because the configurations of optical waveguides formed on an SOI substrate are well known, detailed descriptions of the optical waveguides are omitted here. The optical coupler 45 is an optical waveguide having a width W and a length L.

An input port I1 of the first input waveguide 41 is connected to the first waveguide 31, and an input port I3 of the third input waveguide 43 is connected to the second waveguide 32. An input port I2 of the second input waveguide 42 and an input port I4 of the fourth input waveguide 44 are open-ended. Ends of the first through fourth input waveguides 41-44 located opposite the input ports I1 through I4 are connected to the optical coupler 45.

As illustrated in FIG. 5, the first input waveguide 41 is disposed at a distance of 3W/8 from a center position indicated by a dashed-dotted line C in the width direction of the optical coupler 45, and the second input waveguide 42 is disposed at a distance of W/8 from the center position in the width direction of the optical coupler 45. The third input waveguide 43 is disposed at a distance of W/8 from the center position in the width direction of the optical coupler 45, and is located opposite the second input waveguide 42 across the center position. The fourth input waveguide 44 is disposed at a distance of 3W/8 from the center position in the width direction of the optical coupler 45, and is located opposite the first input waveguide 41 across the center position.

The second output port O2 of the second output waveguide 47 is disposed to face the first monitoring device 21, and the fourth output port O4 of the fourth output waveguide 49 is disposed to face the second monitoring device 22. The first output port O1 of the first output waveguide 46 and the third output port O3 of the third output waveguide 48 are open-ended. Ends of the first through fourth output waveguides 46-49 located opposite the output ports O1 through O4 are connected to the optical coupler 45.

As illustrated in FIG. 5, the first output waveguide 46 is disposed at a distance of 3W/8 from the center position indicated by the dashed-dotted line C in the width direction of the optical coupler 45, and the second output waveguide 47 is disposed at a distance of W/8 from the center position in the width direction of the optical coupler 45.

Thus, the first output waveguide 46 is disposed opposite the first input waveguide 41, and the second output waveguide 47 is disposed opposite the second input waveguide 42.

The third output waveguide 48 is disposed at a distance of W/8 from the center position in the width direction of the optical coupler 45, and is located opposite the second output waveguide 47 across the center position. The fourth output waveguide 49 is disposed at a distance of 3W/8 from the center position in the width direction of the optical coupler 45, and is located opposite the first output waveguide 46 across the center position.

Thus, the third output waveguide 48 is disposed opposite the third input waveguide 43, and the fourth output waveguide 49 is disposed opposite the fourth input waveguide 44.

The width W and the length L of the optical coupler 45 are set such that the quantities of the second light P2 and the fourth light P4 output from the second output port O2 and the fourth output port O4 become greater than the quantities of the first light P1 and the third light P3 output from the first output port O1 and the third output port O3. It is known that in a 90° hybrid implemented by a 4×4 MMI coupler, the ratios of the quantities of light output from four output ports depend on the width and length of an optical coupler (see, for example, "Fully passive Si-photonic 90° hybrid for coherent receiver applications", K. Voigt et. al., ECOC2011). In the wavelength filter 20, the width W and the length L of the optical coupler 45 are set such that the quantities of the second light P2 and the fourth light P4 received by the first monitoring device 21 and the second monitoring device become greater than the quantities of the first light P1 and the third light P3. That is, in the wavelength filter 20, the quantities of the first light P1 and the third light P3 output from the first output port O1 and the third output port O3 are decreased to increase the quantities of the second light P2 and the fourth light P4 output from the second output port O2 and the fourth output port O4.

Figure 6:
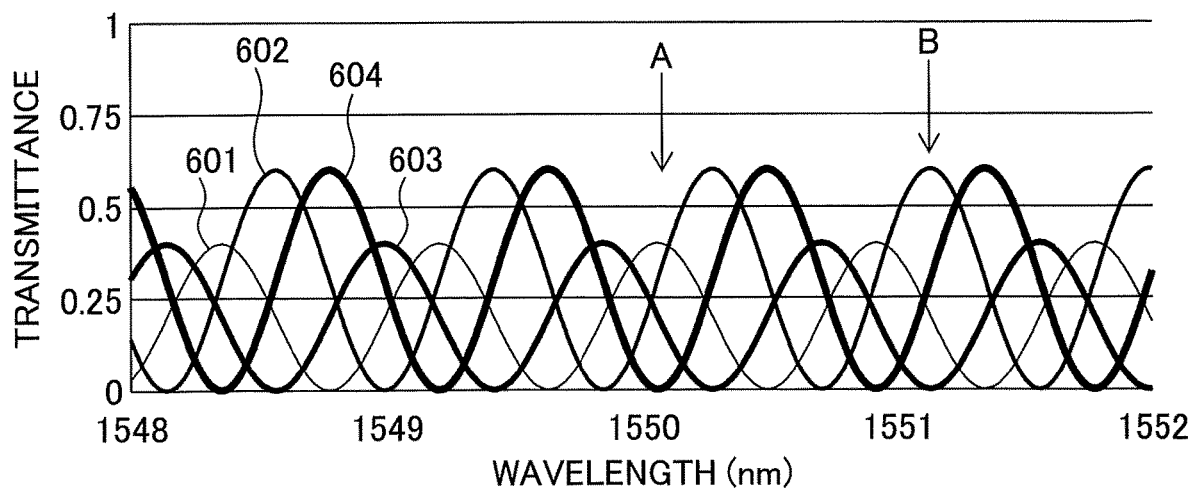
FIG. 6 is a graph illustrating an example of a filtering characteristic of a wavelength filter in FIG. 4.

FIG. 6 is a graph illustrating a filtering characteristic of the wavelength filter 20. In FIG. 6, the horizontal axis indicates the wavelength of light input to the wavelength filter 20, and the vertical axis indicates the transmittance of light output from each of the first through fourth output ports O1-O4. A waveform 601 indicates the transmittance of the first light P1 output from the first output port O1, and a waveform 602 indicates the transmittance of the second light P2 output from the second output port O2. A waveform 603 indicates the transmittance of the third light P3 output from the third output port O3, and a waveform 604 indicates the transmittance of the fourth light P4 output from the fourth output port O4. The optical transmittance of light output from each of the first output port O1, the second output port O2, the third output port O3, and the fourth output port O4 is indicated by a ratio of the quantity of light output from each of the first output port O1, the second output port O2, the third output port O3, and the fourth output port O4 to the total quantity of light output from the first output port O1, the second output port O2, the third output port O3, and the fourth output port O4.

The maximum transmittances of the second light P2 received by the first monitoring device 21 and the fourth light P4 received by the second monitoring device 22 are greater than the maximum transmittances of the first light P1 and the third light P3 that are not received by the first monitoring device 21 and the second monitoring device 22. Also, near a wavelength of 1550 nm indicated by an arrow A in FIG. 6, the rate of change in the transmittance, i.e., the quantity, of the second light P2 received by the first monitoring device 21 in relation to wavelength variations becomes maximum. On the other hand, near a wavelength of 1551 nm indicated by an arrow B in FIG. 6, the rate of change in the transmittance, i.e., the quantity, of the fourth light P4 received by the second monitoring device 22 in relation to wavelength variations becomes maximum.

The controller 3 may be implemented by a hardware processor and a memory storing a program that is executed by the processor to perform various processes. For example, the controller 3 is comprised of a logic circuit implemented by a CMOS transistor formed on a silicon substrate and a storage circuit implemented by a flash memory. The controller 3 includes a wavelength controller 301 and an output controller 302.

FIG. 7 is a flowchart illustrating a wavelength control process performed by the wavelength controller 301. The wavelength control process of FIG. 7 is executed by a logic circuit implementing the wavelength controller 301.

The wavelength controller 301 obtains, from the optical unit 2, an output detection signal indicating an electric current supplied form the output monitoring device 16 according to the quantity of output light (S101). Next, the wavelength controller 301 obtains, from the optical unit 2, a first wavelength detection signal indicating an electric current supplied form the first monitoring device 21 according to the quantity of the second light P2 (S102). Next, the wavelength controller 301 obtains, from the optical unit 2, a second wavelength detection signal indicating an electric current supplied form the second monitoring device 22 according to the quantity of the fourth light P4 (S103).

Then, the wavelength controller 301 selects one of the electric currents corresponding to the first wavelength detection signal and the second wavelength detection signal to be used for the wavelength control process (S104). Specifically, the wavelength controller 301 determines whether to use the electric current corresponding to the first wavelength detection signal or the electric current corresponding to the second wavelength detection signal for the wavelength control process according to a target wavelength stored in the storage circuit. For example, when the target wavelength is 1550 nm indicated by the arrow A in FIG. 6, the rate of change in the quantity of the second light P2 in relation to wavelength variations is high, and therefore the wavelength controller 301 determines to use the first wavelength detection signal input from the first monitoring device 21 for the wavelength control process. As another example, when the target wavelength is 1551 nm indicated by the arrow B in FIG. 6, the rate of change in the quantity of the fourth light P4 in relation to wavelength variations is high, and therefore the wavelength controller 301 determines to use the second wavelength detection signal input from the second monitoring device 22 for the wavelength control process.

If it is determined to use the electric current corresponding to the first wavelength detection signal for the wavelength control process (YES at S104), the wavelength controller 301 estimates the wavelength of output light output from the optical unit 2 by using the electric current corresponding to the first wavelength detection signal (S105). Specifically, the wavelength controller 301 estimates the wavelength of output light output from the optical unit 2 based on a ratio of the electric current corresponding to the first wavelength detection signal obtained at step S102 to the electric current corresponding to the output detection signal obtained at step S101. For example, the wavelength controller 301 estimates the wavelength of the output light by comparing the ratio of the electric current obtained at step S102 to the electric current obtained at step S101 with a table stored in the storage circuit and indicating a relationship between electric current ratios and wavelengths.

Then, the wavelength controller 301 determines whether the wavelength of the output light estimated at step S105 is longer than the target wavelength stored in the storage circuit (S106).

When the wavelength of the output light is longer than the target wavelength (YES at S106), the wavelength controller 301 outputs a wavelength control signal to decrease the wavelength of the output light to the optical unit 2 (S107). In response to the wavelength control signal, a heater (not shown) of the optical unit 2 adjusts the temperature of the ring filter 13 such that the wavelength of the output light is decreased.

When the wavelength of the output light is shorter than the target wavelength (NO at S106), the wavelength controller 301 outputs a wavelength control signal to increase the wavelength of the output light to the optical unit 2 (S108). In response to the wavelength control signal, the heater of the optical unit 2 adjusts the temperature of the ring filter 13 such that the wavelength of the output light is increased.

If it is determined to use the electric current corresponding to the second wavelength detection signal for the wavelength control process (NO at S104), the wavelength controller 301 estimates the wavelength of output light output from the optical unit 2 by using the electric current corresponding to the second wavelength detection signal (S109). Specifically, the wavelength controller 301 estimates the wavelength of output light output from the optical unit 2 based on a ratio of the electric current corresponding to the second wavelength detection signal obtained at step S103 to the electric current corresponding to the output detection signal obtained at step S101. For example, the wavelength controller 301 estimates the wavelength of the output light by comparing the ratio of the electric current obtained at step S103 to the electric current obtained at step S101 with a table stored in the storage circuit and indicating a relationship between electric current ratios and wavelengths.

Then, the wavelength controller 301 determines whether the wavelength of the output light estimated at step S109 is longer than the target wavelength stored in the storage circuit (S110).

When the wavelength of the output light is longer than the target wavelength (YES at S110), the wavelength controller 301 outputs a wavelength control signal to decrease the wavelength of the output light to the optical unit 2 (S111).

In response to the wavelength control signal, the heater (not shown) of the optical unit 2 adjusts the temperature of the ring filter 13 such that the wavelength of the output light is decreased.

When the wavelength of the output light is shorter than the target wavelength (NO at S110), the wavelength controller 301 outputs a wavelength control signal to increase the wavelength of the output light to the optical unit 2 (S112). In response to the wavelength control signal, the heater of the optical unit 2 adjusts the temperature of the ring filter 13 such that the wavelength of the output light is increased.

The output controller 302 obtains, from the optical unit 2, an output detection signal indicating an electric current supplied form the output monitoring device 16 according to the quantity of the output light, and controls the quantity of the output light based on the electric current corresponding to the obtained output detection signal. For example, the output controller 302 determines the quantity of the output light based on the electric current corresponding to the output detection signal and a table stored in the storage circuit and indicating a relationship between electric currents and light quantities, and compares the determined quantity of the output light with a target light quantity stored in the storage circuit.

When the quantity of the output light is greater than the target light quantity, the output controller 302 outputs, to the optical unit 2, a first output control signal and a second output control signal to decrease the quantity of the output light. When the quantity of the output light is less than the target light quantity, the output controller 302 outputs, to the optical unit 2, a first output control signal and a second output control signal to increase the quantity of the output light.

The first output control signal is, for example, an electric current supplied to the light source 10 of the optical unit 2. The second output control signal is for example, an electric current supplied to the amplifier 14 of the optical unit 2. The output controller 302 may be configured to control the quantity of the output light by alternately outputting the first output control signal and the second output control signal or by changing electric currents corresponding to the first output control signal and the second output control signal at predetermined rates.

<Effects of Tunable Light Source of Embodiment>

The tunable light source 1 of the embodiment is configured such that the quantity of light received by a light-receiving device becomes greater than the quantity of light not received by any light-receiving device. This configuration makes it possible to increase the quantity of light received by the light-receiving device without increasing the quantity of light input to the wavelength filter 20.

For example, in the tunable light source 1 of the embodiment, the 90° hybrid 33 implemented by a 4×4 MMI coupler is configured such that the maximum quantities of light output from four output ports differ from each other and the quantity of light received by a light-receiving device is increased.

That is, in the tunable light source 1 of the embodiment, the maximum quantity of light output from an output waveguide whose output port is disposed to face a light-receiving device is greater than the maximum quantity of light output from an output waveguide whose output port is disposed not to face the light-receiving device.

Thus, the tunable light source 1 of the embodiment is configured to increase the quantity of light received by a light-receiving device and decrease the quantity of light not received by any light-receiving device. This configuration makes it possible to control the wavelength of output light while reducing the quantity of wasted light.

<Variations of Tunable Light Source>

In the tunable light source 1, the quantities of light output from the first through fourth output ports O1-O4 of the 90° hybrid 33 are set by adjusting the width W and the length L of the optical coupler 45. However, the quantities of light output from the first through fourth output ports O1-O4 of the 90° hybrid 33 may be set by various methods.

Figure 8A:
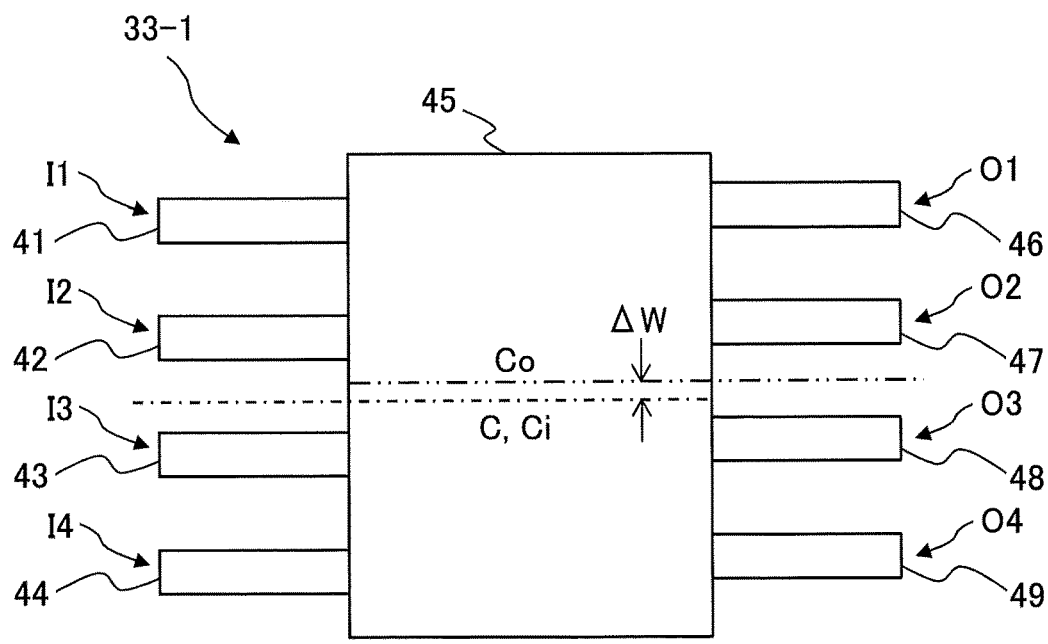
FIG. 8A is a drawing illustrating a first variation of a 90° hybrid of the tunable light source of the embodiment.
Figure 8B:
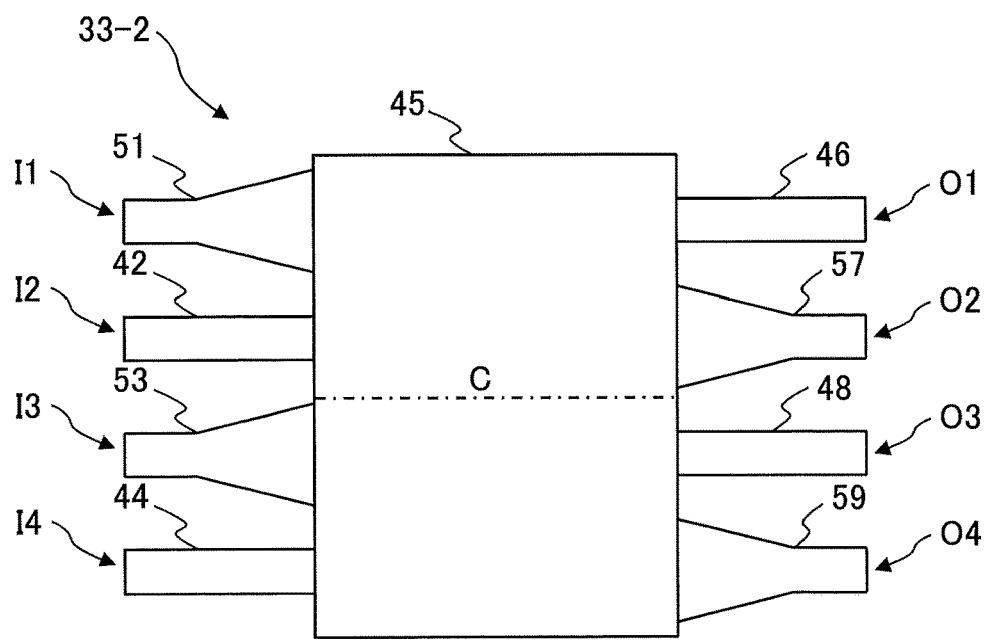
FIG. 8B is a drawing illustrating a second variation of a 90° hybrid of the tunable light source of the embodiment.

FIG. 8A is a drawing illustrating a 90° hybrid 33-1 that is a first variation of the 90° hybrid 33 of the embodiment, and FIG. 8B is a drawing illustrating a 90° hybrid 33-2 that is a second variation of the 90° hybrid 33 of the embodiment.

The 90° hybrid 33-1 is different from the 90° hybrid 33 in the positions of the first through fourth output waveguides 46-49. The configurations of the 90° hybrid 33-1 other than the positions of the first through fourth output waveguides 46-49 are substantially the same as the configurations of the 90° hybrid 33, and therefore their detailed descriptions are omitted here.

In the 90° hybrid 33-1, a center position $C_i$ in the width direction of the first through fourth input waveguides 41-44 matches the center position C in the width direction of the optical coupler 45. On the other hand, a center position $C_o$ in the width direction of the first through fourth output waveguides 46-49 does not match (or is shifted from) the center position C in the width direction of the optical coupler 45. In the 90° hybrid 33-1, the center position $C_o$ in the width direction of the first through fourth output waveguides 46-49 is set such that the quantities of the second light P2 and the fourth light P4 become greater than the quantities of the first light P1 and the third light P3.

Instead of the center position Co in the width direction of the first through fourth output waveguides 46-49, the center position Ci in the width direction of the first through fourth input waveguides 41-44 may be shifted from the center position C in the width direction of the optical coupler 45. In this case, the center position Ci of the first through fourth input waveguides 41-44 is set such that the quantities of the second light P2 and the fourth light P4 become greater than the quantities of the first light P1 and the third light P3.

The 90° hybrid 33-2 is different from the 90° hybrid 33 in that the first input waveguide 41 connected to the first waveguide 31 and the third input waveguide 43 connected to the second waveguide 32 are replaced with a first input waveguide 51 and a third input waveguide 53. The 90° hybrid 33-2 is also different from the 90° hybrid 33 in that the second output waveguide 47 disposed to face the first monitoring device 21 and the fourth output waveguide 49 disposed to face the second monitoring device 22 are replaced with a second output waveguide 57 and a fourth output waveguide 59. The configurations of the 90° hybrid 33-2 other than the first input waveguide 51, the third input waveguide 53, the second output waveguide 57, and the fourth output waveguide 59 are substantially the same as the configurations of the 90° hybrid 33, and therefore their detailed descriptions are omitted here.

The areas of surfaces of the first input waveguide 51 and the third input waveguide 53 contacting the optical coupler 45 are greater than the areas of surfaces of the second input waveguide 42 and the fourth input waveguide 44 contacting the optical coupler 45. Thus, in the 90° hybrid 33-2, the area of an optical-coupler-contacting surface of an input waveguide through which light passes is made greater than the area of an optical-coupler-contacting surface of an input waveguide through which no light passes. This configuration makes it possible to increase the quantity of light to be output from the 90° hybrid 33-2.

Also, the areas of surfaces of the second output waveguide 57 and the fourth output waveguide 59 contacting the optical coupler 45 are greater than the areas of surfaces of the first output waveguide 46 and the third output waveguide 48 contacting the optical coupler 45. Thus, in the 90° hybrid 33-2, the area of an optical-coupler-contacting surface of an output waveguide disposed to face a light-receiving device is made greater than the area of an optical-coupler-contacting surface of an output waveguide disposed not to face the light-receiving device. This configuration makes it possible to increase the quantity of light to be output from the 90° hybrid 33-2.

The tunable light source 1 is configured such that light is input to the first input waveguide 41 and the third input waveguide 43 of the 90° hybrid 33, and the first monitoring device 21 and the second monitoring device 22 are disposed to face the second output waveguide 47 and the fourth output waveguide 49 of the 90° hybrid 33. However, the 90° hybrid 33 of the tunable light source 1 may have any other configuration as long as the rate of change in the quantity of light output from an output waveguide in relation to wavelength variations is high when the rate of change in the quantity of light output from another output waveguide in relation to wavelength variations is low.

FIG. 9 is a table illustrating combinations of input waveguides of the 90° hybrid 33 connectable to the first waveguide 31 and the second waveguide 32 and output waveguides of the 90° hybrid 33 having output ports disposed to face the first monitoring device 21 and the second monitoring device 22.

In FIG. 9, in each of first through fourth patterns included in a first group, the first waveguide and the second waveguide 32 are connected to the first input waveguide 41 and the second input waveguide 42. In the first pattern, the first monitoring device 21 is disposed to face the output port O1 of the first output waveguide 46, and the second monitoring device 22 is disposed to face the output port O2 of the second output waveguide 47. In the second pattern, the first monitoring device 21 is disposed to face the output port O1 of the first output waveguide 46, and the second monitoring device 22 is disposed to face the output port O3 of the third output waveguide 48. In the third pattern, the first monitoring device 21 is disposed to face the output port O2 of the second output waveguide 47, and the second monitoring device 22 is disposed to face the output port O4 of the fourth output waveguide 49. In the fourth pattern, the first monitoring device 21 is disposed to face the output port O3 of the third output waveguide 48, and the second monitoring device 22 is disposed to face the output port O4 of the fourth output waveguide 49.

In FIG. 9, in each of fifth through eighth patterns included in a second group, the first waveguide 31 and the second waveguide 32 are connected to the first input waveguide 41 and the third input waveguide 43. In the fifth pattern, the first monitoring device 21 is disposed to face the output port O1 of the first output waveguide 46, and the second monitoring device 22 is disposed to face the output port O2 of the second output waveguide 47. In the sixth pattern, the first monitoring device 21 is disposed to face the output port O1 of the first output waveguide 46, and the second monitoring device 22 is disposed to face the output port O3 of the third output waveguide 48. In the seventh pattern, the first monitoring device 21 is disposed to face the output port O2 of the second output waveguide 47, and the second monitoring device 22 is disposed to face the output port O4 of the fourth output waveguide 49. In the eighth pattern, the first monitoring device 21 is disposed to face the output port O3 of the third output waveguide 48, and the second monitoring device 22 is disposed to face the output port O4 of the fourth output waveguide 49.

In FIG. 9, in each of ninth through twelfth patterns included in a third group, the first waveguide and the second waveguide 32 are connected to the second input waveguide 42 and the fourth input waveguide 44. In the ninth pattern, the first monitoring device 21 is disposed to face the output port O1 of the first output waveguide 46, and the second monitoring device 22 is disposed to face the output port O2 of the second output waveguide 47. In the tenth pattern, the first monitoring device 21 is disposed to face the output port O1 of the first output waveguide 46, and the second monitoring device 22 is disposed to face the output port O3 of the third output waveguide 48. In the eleventh pattern, the first monitoring device 21 is disposed to face the output port O2 of the second output waveguide 47, and the second monitoring device 22 is disposed to face the output port O4 of the fourth output waveguide 49. In the twelfth pattern, the first monitoring device 21 is disposed to face the output port O3 of the third output waveguide 48, and the second monitoring device 22 is disposed to face the output port O4 of the fourth output waveguide 49.

In FIG. 9, in each of thirteenth through sixteenth patterns included in a fourth group, the first waveguide 31 and the second waveguide 32 are connected to the third input waveguide 43 and the fourth input waveguide 44. In the thirteenth pattern, the first monitoring device 21 is disposed to face the output port O1 of the first output waveguide 46, and the second monitoring device 22 is disposed to face the output port O2 of the second output waveguide 47. In the fourteenth pattern, the first monitoring device 21 is disposed to face the output port O1 of the first output waveguide 46, and the second monitoring device 22 is disposed to face the output port O3 of the third output waveguide 48.

In the fifteenth pattern, the first monitoring device 21 is disposed to face the output port O2 of the second output waveguide 47, and the second monitoring device 22 is disposed to face the output port O4 of the fourth output waveguide 49. In the sixteenth pattern, the first monitoring device 21 is disposed to face the output port O3 of the third output waveguide 48, and the second monitoring device 22 is disposed to face the output port O4 of the fourth output waveguide 49.

<Application of Tunable Light Source of Embodiment>

Figure 10:
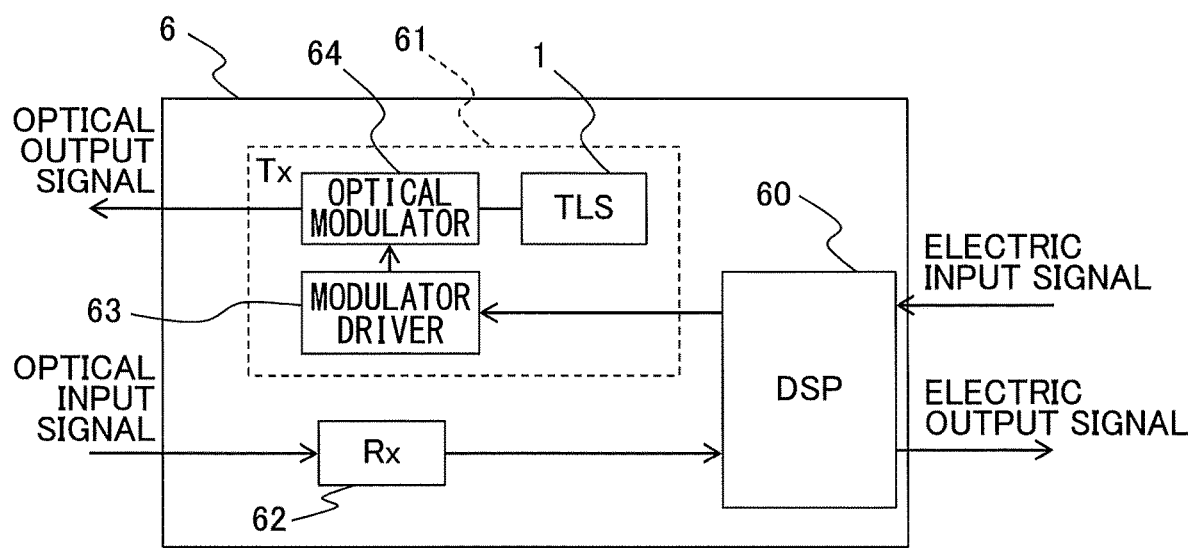
FIG. 10 is a drawing illustrating an optical module including the tunable light source of the embodiment.

FIG. 10 is a drawing illustrating an optical module 6 including the tunable light source 1 of the embodiment.

The optical module 6 includes a digital signal processor (DSP) 60, a transmitter 61, and a receiver 62. The transmitter 61 includes the tunable light source 1, a modulator driver 63, and an optical modulator 64.

The DSP 60 receives an electric input signal, processes data corresponding to the electric input signal, and outputs an electric signal indicating the processed data to the modulator driver 63. The DSP 60 also receives an electric signal from the receiver 62, processes data corresponding to the received electric signal, and outputs an electric output signal indicating the processed data.

The modulator driver 63 outputs the electric signal received from the DSP 60 to the optical modulator 64. Based on the electric signal received from the modulator driver 63, the optical modulator 64 modulates output light output from the tunable light source 1, and outputs the modulated light as an optical output signal. For example, the optical modulator 64 modulates the output light according to dual polarization-quadrature phase shift keying (DP-QPSK).

An aspect of this disclosure provides a tunable light source that can control the wavelength of output light while reducing the quantity of wasted light.

Another aspect of this disclosure provides a method of controlling a tunable light source. The tunable light source includes a light source; a wavelength selecting device that selects, according to a control signal, output light with a specific wavelength from light output from the light source; a wavelength monitor including a wavelength filter including multiple output ports corresponding to filtering paths through which the output light passes, and a light-receiving device that is disposed to face one of the output ports and receives light output from the one of the output ports; and a controller that generates the control signal based on the quantity of the light received by the light-receiving device such that the wavelength of the output light matches a target wavelength, and outputs the generated control signal to the wavelength selecting device. The wavelength filter is configured such that the maximum quantity of the light output from the one of the output ports facing the light-receiving device becomes greater than a maximum quantity of light output from another one of the output ports not facing any light-receiving device. The method includes obtaining, from the wavelength monitor, light quantity indicators indicating the quantities of the light output from the output ports; selecting one of the light quantity indicators, estimating the wavelength of the output light based on a quantity of the light indicated by the selected one of the light quantity indicators, generating the control signal based on a result of comparing the estimated wavelength with the target wavelength, and outputting the generated control signal to the wavelength selecting device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A tunable light source, comprising:
   a light source;
   a wavelength selecting device that selects, according to a control signal, output light with a specific wavelength from light output from the light source; and
   a wavelength monitor including
      a wavelength filter including multiple output ports corresponding to filtering paths through which the output light passes, and
      a light-receiving device that is disposed to face one of the output ports and receives light output from the one of the output ports, wherein
   the wavelength filter is configured such that a maximum quantity of the light output from the one of the output ports that faces the light-receiving device becomes greater than a maximum quantity of light output from another one of the output ports that does not face the light-receiving device;
   the output ports comprise two or more output ports;
   the wavelength filter includes
      a splitter that splits the output light into first light and second light,
      a first waveguide through which the first light passes,
      a second waveguide through which the second light passes, the first waveguide and the second waveguide having different lengths, and
      an optical divider that combines the first light and the second light input from the first waveguide and the second waveguide, splits the combined light into two or more light beams, and outputs the light beams to the two or more output ports; and
   the optical divider is configured to split the combined light such that maximum quantities of the light beams become different from each other.

2. A tunable light source, comprising:
   a light source;
   a wavelength selecting device that selects, according to a control signal, output light with a specific wavelength from light output from the light source;
   a wavelength monitor including
      a wavelength filter including multiple output ports corresponding to filtering paths through which the output light passes, and
      at least one light-receiving device that is disposed to face one of the output ports and receives light output from the one of the output ports; and
   a controller that generates the control signal based on a quantity of the light received by the light-receiving device such that the wavelength of the output light matches a target wavelength, and outputs the generated control signal to the wavelength selecting device, wherein the wavelength filter is configured such that a maximum quantity of the light output from the one of the output ports that faces the light-receiving device becomes greater than a maximum quantity of light output from another one of the output ports that does not face the light-receiving device;

the output ports comprise two or more output ports;

the wavelength filter includes
  a splitter that splits the output light into first light and second light,
  a first waveguide through which the first light passes,
  a second waveguide through which the second light passes, the first waveguide and the second waveguide having different lengths, and
  an optical divider that combines the first light and the second light input from the first waveguide and the second waveguide, splits the combined light into two or more light beams, and outputs the light beams to the two or more output ports; and the optical divider is configured to split the combined light such that maximum quantities of the light beams become different from each other.

3. The tunable light source as claimed in claim 2, wherein the at least one light-receiving device comprises two light-receiving devices;

the optical divider includes
  four input waveguides two of which are connected to the first waveguide and the second waveguide,
  an optical coupler one end of which is connected to the four input waveguides, and
  four output waveguides including first ends that are connected to another end of the optical coupler and second ends having the output ports, two of the output ports facing the light-receiving devices; and the optical divider is configured such that the maximum quantities of two of the light beams output from two of the output waveguides whose output ports face the light-receiving devices are greater than the maximum quantities of two of the light beams output from other two of the output waveguides.

4. The tunable light source as claimed in claim 3, wherein the four input waveguides are arranged at regular intervals in a width direction of the optical coupler, and the four output waveguides are arranged at regular intervals in the width direction of the optical coupler;

one of a center position of the four input waveguides in the width direction and a center position of the four output waveguides in the width direction matches a center position of the optical coupler in the width direction; and another one of the center position of the four input waveguides in the width direction and the center position of the four output waveguides in the width direction is shifted from the center position of the optical coupler in the width direction.

5. The tunable light source as claimed in claim 3, wherein the input waveguides include two connected input waveguides connected to the first waveguide and the second waveguide and two non-connected input waveguides not connected to the first waveguide and the second waveguide; and areas of surfaces of the connected input waveguides contacting the optical coupler are greater than areas of surfaces of the non-connected input waveguides contacting the optical coupler.

6. The tunable light source as claimed in claim 3, wherein the output waveguides include two facing output waveguides whose output ports face the light-receiving devices and two non-facing output waveguides whose output ports face no light-receiving device; and areas of surfaces of the facing output waveguides contacting the optical coupler are greater than areas of surfaces of the non-facing output waveguides contacting the optical coupler.

7. An optical module, comprising:

a tunable light source; and an optical modulator that modulates output light output from the tunable light source and outputs the modulated light, wherein the tunable light source includes
  a light source,
  a wavelength selecting device that selects, according to a control signal, the output light with a specific wavelength from light output from the light source,
  a wavelength monitor including
    a wavelength filter including multiple output ports corresponding to filtering paths through which the output light passes, and
    a light-receiving device that is disposed to face one of the output ports and receives light output from the one of the output ports, and
  a controller that generates the control signal based on a quantity of the light received by the light-receiving device such that the wavelength of the output light matches a target wavelength, and outputs the generated control signal to the wavelength selecting device; and wherein the wavelength filter is configured such that a maximum quantity of the light output from the one of the output ports that faces the light-receiving device becomes greater than a maximum quantity of light output from another one of the output ports that does not face the light-receiving device;

the output ports comprise two or more output ports;

the wavelength filter includes
  a splitter that splits the output light into first light and second light,
  a first waveguide through which the first light passes,
  a second waveguide through which the second light passes, the first waveguide and the second waveguide having different lengths, and
  an optical divider that combines the first light and the second light input from the first waveguide and the second waveguide, splits the combined light into two or more light beams, and outputs the light beams to the two or more output ports; and the optical divider is configured to split the combined light such that maximum quantities of the light beams become different from each other.

* * * * *